United States Patent
Hayashishita

(10) Patent No.: US 11,453,208 B2
(45) Date of Patent: Sep. 27, 2022

(54) ADHESIVE LAMINATE FILM AND METHOD FOR MANUFACTURING ELECTRONIC DEVICE

(71) Applicant: MITSUI CHEMICALS TOHCELLO, INC., Tokyo (JP)

(72) Inventor: Eiji Hayashishita, Nagoya (JP)

(73) Assignee: MITSUI CHEMICAL TOHCELLO, INC., Tokyo (JP)

(*) Notice: Subject to any disclaimer, the term of this patent is extended or adjusted under 35 U.S.C. 154(b) by 715 days.

(21) Appl. No.: 16/463,440

(22) PCT Filed: Nov. 16, 2017

(86) PCT No.: PCT/JP2017/041331
§ 371 (c)(1),
(2) Date: May 23, 2019

(87) PCT Pub. No.: WO2018/097036
PCT Pub. Date: May 31, 2018

(65) Prior Publication Data
US 2020/0171802 A1    Jun. 4, 2020

(30) Foreign Application Priority Data
Nov. 25, 2016 (JP) .............................. JP2016-229118

(51) Int. Cl.
*B32B 27/08*   (2006.01)
*B32B 27/30*   (2006.01)
(Continued)

(52) U.S. Cl.
CPC .............. *B32B 27/08* (2013.01); *C09J 7/255* (2018.01); *C09J 133/06* (2013.01);
(Continued)

(58) Field of Classification Search
CPC ........ B32B 27/08; B32B 27/306; C09J 7/255; C09J 133/06; H01M 50/124; H01L 21/6838
See application file for complete search history.

(56) References Cited

U.S. PATENT DOCUMENTS 7,067,030 B2 * 6/2006 Kiuchi .................... A61P 31/18
                                                    428/317.5
8,986,486 B2 * 3/2015 Takamoto ............... B32B 38/10
                                                    156/264
(Continued)

FOREIGN PATENT DOCUMENTS

CN    102399506 A    4/2012
JP    H10163281 A    6/1998
(Continued)

OTHER PUBLICATIONS

English machine translation on espace.net of JP2012-62405 to Ikushima, 24pages, Mar. 29, 2012. (Year: 2012).*
(Continued)

*Primary Examiner* — Linda L Gray
(74) *Attorney, Agent, or Firm* — Buchanan Ingersoll & Rooney PC

(57) ABSTRACT

An adhesive laminate film has a heat-resistant resin layer, a flexible resin layer, and an adhesive resin layer in this order, a peel strength P0 between the heat-resistant resin layer and the flexible resin layer, which is based on JIS Z0237 and measured under defined conditions, is equal to or more than 0.01 N/25 mm and equal to or less than 2.0 N/25 mm, and a peel strength P1 between the heat-resistant resin layer and the flexible resin layer after a thermal treatment of the adhesive laminate film at 160° C. for four hours is equal to or more than 0.05 N/25 mm and equal to or less than 1.5 N/25 mm.

18 Claims, 3 Drawing Sheets

(51) Int. Cl.
*H01L 21/683* (2006.01)
*H01M 50/124* (2021.01)
*C09J 7/25* (2018.01)
*C09J 133/06* (2006.01)

(52) U.S. Cl.
CPC ...... *H01L 21/6836* (2013.01); *H01M 50/124* (2021.01); *B32B 27/306* (2013.01)

(56) References Cited

U.S. PATENT DOCUMENTS

| | | | |
|---|---|---|---|
| 10,566,254 B2 | 2/2020 | Hayashishita | |
| 2010/0144120 A1* | 6/2010 | Segawa | H01L 21/6835 438/464 |
| 2012/0070658 A1 | 3/2012 | Ikishima et al. | |
| 2012/0070960 A1* | 3/2012 | Murata | C09J 133/14 438/464 |
| 2013/0130001 A1 | 5/2013 | Aoyama et al. | |
| 2020/0312810 A1 | 10/2020 | Hayashishita | |

FOREIGN PATENT DOCUMENTS

| | | |
|---|---|---|
| JP | H11199840 A | 7/1999 |
| JP | 2006335787 A | 12/2006 |
| JP | 2012062405 A | 3/2012 |
| JP | 2013227435 A | 11/2013 |
| TW | 201213124 A | 4/2012 |
| WO | 2017169896 A1 | 10/2017 |
| WO | 2017170451 A1 | 10/2017 |

OTHER PUBLICATIONS

Extended European Search Report dated Sep. 14, 2020, by the European Patent Office in corresponding European Patent Application No. 17873047.9. (21 pages).

Office Action dated Jul. 7, 2021, by the Taiwanese Patent Office in corresponding Taiwanese Patent Application No. 106140052. (3 pages).

International Search Report (PCT/ISA/210) with translation and Written Opinion (PCT/ISA/237) dated Dec. 19, 2017, by the Japanese Patent Office as the International Searching Authority for International Application No. PCT/JP2017/041331.

Office Action dated Dec. 18, 2020, by the State Intellectual Property Office of the People's Republic of China in corresponding Chinese Patent Application No. 201780072984.6. (6 pages).

Wang, Jianqing, "Packaging Materials Science," China Light Industry Publishing Co., Ltd., p. 119, Jan. 2009, with partial English translation. (10 pages).

\* cited by examiner

ADHESIVE LAMINATE FILM AND METHOD FOR MANUFACTURING ELECTRONIC DEVICE

TECHNICAL FIELD

The present invention relates to an adhesive laminate film and a method for manufacturing an electronic device.

BACKGROUND ART

In a step of manufacturing electronic devices, there is a case where the characteristics of electronic components are evaluated.

In a step of evaluating the characteristics of electronic components, the characteristics of electronic components are evaluated, for example, at a high temperature or a low temperature. Therefore, the deterioration of electronic components having a potential cause for the generation of a defect can be accelerated, an initial defect of the electronic components is generated in an early stage, and defective products can be removed. Therefore, it is possible to efficiently obtain electronic components having excellent reliability.

As a technique relating to acceleration tests for the above-described evaluation of the characteristics of electronic components, for example, a technique described in Patent Document 1 (Japanese Laid-open Patent Publication No. H10-163281) is exemplified.

Patent Document 1 describes a method for manufacturing a semiconductor element in which a semiconductor wafer on which a plurality of semiconductor elements is formed is diced, electrodes formed in the semiconductor elements are electrically connected to one another by pressing contact terminals connected to a tester to the electrodes in a state in which positional relationships among the diced semiconductor elements are held, and the semiconductor elements are inspected in a connected state by an operating characteristic test using the tester, thereby manufacturing the semiconductor elements.

RELATED DOCUMENT

Patent Document

[Patent Document 1] Japanese Laid-open Patent Publication No. H10-163281

SUMMARY OF THE INVENTION

Technical Problem

According to the present inventors' studies, regarding methods for manufacturing an electronic device of the related art, the following problems were found.

First, the present inventors found that, in the methods for manufacturing an electronic device of the related art, when the characteristics of electronic components are evaluated at a high temperature or a low temperature, an adhesive film that temporarily fix the electronic components deforms or melts. In this case, the positions of the electronic components on the adhesive film are deviated, and it becomes impossible to successfully pick up the electronic components afterwards.

Furthermore, according to the present inventors' studies, it was clarified that, when the heat resistance of the adhesive film is enhanced in order to suppress the deformation or melting of the adhesive film, the deformation or melting of the adhesive film is suppressed, and the positional deviation of the electronic components is redressed; however, conversely, the stretch property or flexibility of the adhesive film deteriorates, and it becomes impossible to successfully pick up the electronic components afterwards.

That is, for adhesive films of the related art, there was a room for improvement in a property of picking up electronic components after the evaluation of the characteristics of the electronic components at a high temperature or a low temperature.

Therefore, in the methods for manufacturing an electronic device of the related art, from the viewpoint of successfully picking up electronic components, as shown in FIG. 3, it is necessary to temporarily pick up electronic components 70A on an adhesive film 50A to a tray 80A or the like, then, again, move the electronic components 70A using a robot, dispose the electronic components on a stage 90A, evaluate the characteristics of the electronic components 70A at a high temperature or a low temperature, and then, again, move the electronic components 70A to the tray 80A or the like using the robot, which complicates steps.

That is, the present inventors found that there is a room for improvement for the methods for manufacturing an electronic device of the related art from the viewpoint of satisfying both the simplification of the characteristic evaluation step of electronic components and a property of picking up electronic components.

The present invention has been made in consideration of the above-described circumstances and provides an adhesive film capable of simplifying a characteristic evaluation step of electronic components and capable of accurately picking up electronic components.

Solution to Problem

The present inventors repeated intensive studies in order to achieve the above-described object. As a result, the present inventors found that, when, as a film that temporarily fixes an electronic component, an adhesive laminate film having a heat-resistant resin layer, a flexible resin layer, and an adhesive resin layer in this order, in which a peel strength between the heat-resistant resin layer and the flexible resin layer satisfies a specific condition, is used, and the heat-resistant resin layer is peeled off before a pick-up step of the electronic component, it is possible to satisfy both the simplification of a characteristic evaluation step of the electronic components and a property of picking up the electronic components and completed the present invention.

According to the present invention, adhesive laminate films and methods for manufacturing an electronic device described below are provided.

[1] An adhesive laminate film having a heat-resistant resin layer, a flexible resin layer, and an adhesive resin layer in this order, in which a peel strength $P_0$ between the heat-resistant resin layer and the flexible resin layer, which is based on JIS Z0237 and measured using a method described below, is equal to or more than 0.01 N/25 mm and equal to or less than 2.0 N/25 mm, and a peel strength $P_1$ between the heat-resistant resin layer and the flexible resin layer after a thermal treatment of the adhesive laminate film at 160° C. for four hours is equal to or more than 0.05 N/25 mm and equal to or less than 1.5 N/25 mm, (Method for Measuring Peel Strength)

the adhesive laminate film is attached to a silicon wafer so that the adhesive resin layer comes into contact with the silicon wafer. Next, the heat-resistant resin layer is peeled off from the flexible resin layer using a tensile tester in a 180-degree direction under conditions of 25° C. and a tensile rate of 300 mm/minute, a strength (N/25 mm) at this time is measured twice, and an average value is regarded as the peel strength.

[2] The adhesive laminate film according to [1],
in which a tensile elastic modulus (E') of the flexible resin layer at 160° C., which is based on JIS K7161 and measured under conditions of a sample width of 10 mm, an inter-chuck distance of 30 mm, and a tensile rate of 300 mm/minute, is equal to or more than 1 MPa and equal to or less than 300 MPa.

[3]
The adhesive laminate film according to [1] or [2],
in which a melting point of the heat-resistant resin layer is equal to or higher than 200° C. or the heat-resistant resin layer has no melting point.

[4]
The adhesive laminate film according to any one of [1] to [3],
in which a melting point of the flexible resin layer is equal to or higher than 100° C. and equal to or lower than 250° C.

[5]
The adhesive laminate film according to any one of [1] to [4], in which a heat-resistant resin that configures the heat-resistant resin layer includes one or more selected from the group consisting of a polyimide, a polyamide, and a polyester.

[6]
The adhesive laminate film according to any one of [1] to [5],
in which a flexible resin that configures the flexible resin layer includes one or more selected from the group consisting of a polyester-based elastomer, a polyamide-based elastomer, a polyimide-based elastomer, and a polybutylene terephthalate.

[7]
The adhesive laminate film according to any one of [1] to [6],
the film further having an adhesive layer between the heat-resistant resin layer and the flexible resin layer.

[8]
The adhesive laminate film according to [7],
in which the adhesive layer includes a (meth)acrylic adhesive.

[9]
The adhesive laminate film according to [8],
in which the (meth)acrylic adhesive includes a (meth)acrylic adhesive resin and a crosslinking agent, and
a content of the crosslinking agent in the (meth)acrylic adhesive is equal to or more than 5 parts by mass with respect to 100 parts by mass of the (meth)acrylic adhesive resin.

[10]
The adhesive laminate film according to [9],
in which the crosslinking agent includes one or more selected from an epoxy-based compound, an isocyanate-based compound, and an aziridine-based compound.

[11]
The adhesive laminate film according to [9] or [10],
in which the (meth)acrylic adhesive resin that is included in the (meth)acrylic adhesive includes a polyfunctional monomer-derived configurational unit having equal to or more than two carbon-carbon double bonds in a molecule.

[12]
The adhesive laminate film according to any one of [1] to [11],
in which an adhesive that configures the adhesive resin layer includes one or more selected from a (meth)acrylic adhesive, a silicone-based adhesive, an urethane-based adhesive, an olefin-based adhesive, and a styrene-based adhesive.

[13]
The adhesive laminate film according to any one of [1] to [12],
in which a total light transmittance of the adhesive laminate film is equal to or more than 80%.

[14]
The adhesive laminate film according to any one of [1] to [13],
in which the adhesive laminate film is a dicing tape.

[15]
The adhesive laminate film according to any one of [1] to [14],
in which the adhesive laminate film is used as an adhesive laminate film in a method for manufacturing an electronic device, the method including
a step (A) of preparing a structure including the adhesive laminate film having a heat-resistant resin layer, a flexible resin layer, and an adhesive resin layer in this order and one or more electronic components attached onto the adhesive resin layer,
a step (B) of evaluating characteristics of the electronic components in a state of being attached onto the adhesive resin layer,
a step (C) of peeling the heat-resistant resin layer from the adhesive laminate film after the step (B), and
a step (D) of picking up the electronic components from the adhesive resin layer after the step (C).

[16]
A method for manufacturing an electronic device, including
a step (A) of preparing a structure including an adhesive laminate film having a heat-resistant resin layer, a flexible resin layer, and an adhesive resin layer in this order and one or more electronic components attached onto the adhesive resin layer,
a step (B) of evaluating characteristics of the electronic components in a state of being attached onto the adhesive resin layer,
a step (C) of peeling the heat-resistant resin layer from the adhesive laminate film after the step (B), and
a step (D) of picking up the electronic components from the adhesive resin layer after the step (C),
in which the adhesive laminate film according to any one of [1] to [15] is used as the adhesive laminate film.

[17]
The method for manufacturing an electronic device according to [16],
in which, in the step (B), the characteristics of the electronic components are evaluated in a temperature environment of equal to or lower than 0° C. or equal to or higher than 50° C. and equal to or lower than 200° C.

[18]
The method for manufacturing an electronic device according to [16] or [17],
in which, in the step (D), the electronic components are picked up in a state in which intervals between the electronic components adjacent to each other are expanded by extending regions to which the electronic components are attached in the adhesive resin layer in an in-plane direction of the film.

Advantageous Effects of Invention

According to the present invention, it is possible to provide an adhesive film capable of simplifying a characteristic evaluation step of electronic components and capable of accurately picking up electronic components.

BRIEF DESCRIPTION OF THE DRAWINGS

The above-described object and other objects, characteristics, and advantages will be further clarified using a preferred embodiment described below and the accompanying drawings below.

DESCRIPTION OF EMBODIMENTS

Hereinafter, an embodiment of the present invention will be described using drawings. In all of the drawings, the same constituent element will be given the same reference sign and will not be repeated. In addition, the drawings are schematic views and do not match actual dimensional ratios. In addition, unless particularly otherwise described, numerical ranges "A to B" indicate equal to and more than A and equal to and less than B. In addition, in the present embodiment, "(meth)acrylic" refers acrylic, methacrylic, or both acrylic and methacrylic.

1. Adhesive Laminate Film

Hereinafter, an adhesive laminate film 50 according to the present embodiment will be described.

Figure 1:
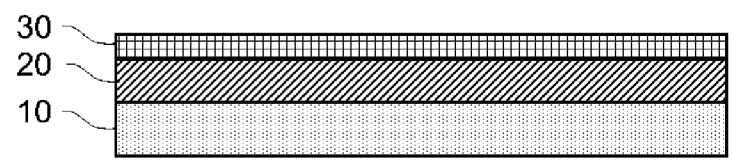
FIG. 1 is a cross-sectional view schematically showing an example of a structure of an adhesive laminate film of an embodiment according to the present invention.
Figure 2:
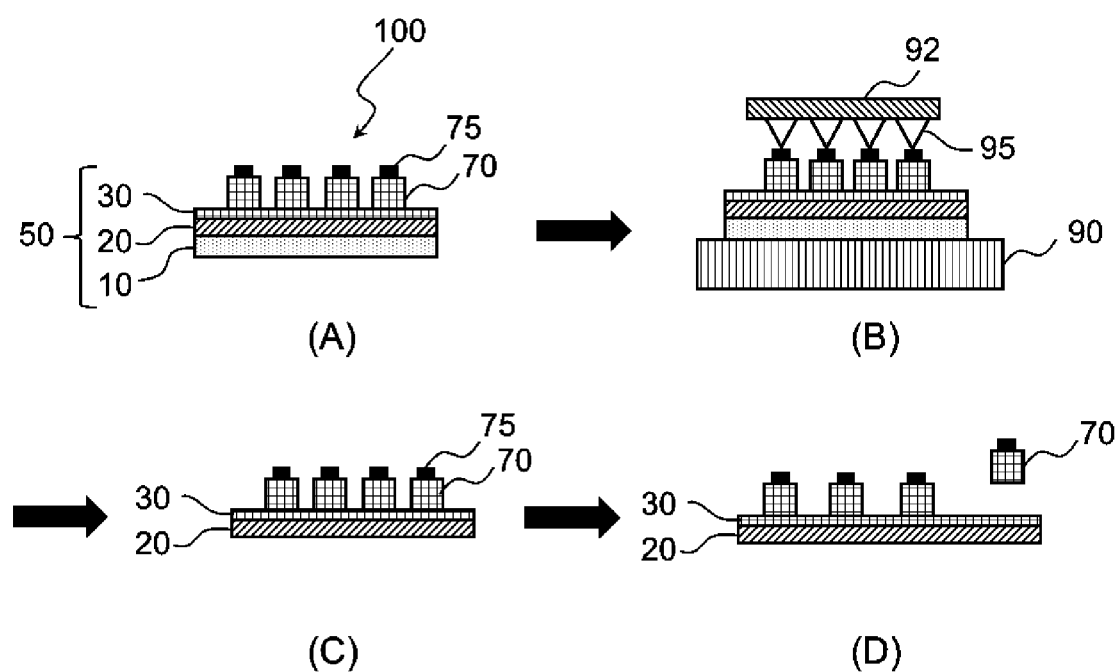
FIG. 2 is a cross-sectional view schematically showing an example of a method for manufacturing an electronic device of an embodiment according to the present invention.

FIG. 1 is a cross-sectional view schematically showing an example of the adhesive laminate film 50 of an embodiment according to the present invention. FIG. 2 is a cross-sectional view schematically showing an example of a method for manufacturing an electronic device of an embodiment according to the present invention.

As shown in FIG. 1, the adhesive laminate film 50 according to the present embodiment has a heat-resistant resin layer 10, a flexible resin layer 20, and an adhesive resin layer 30 in this order. In the adhesive laminate film 50 according to the present embodiment, from the viewpoint of favorably maintaining the adhesiveness between the heat-resistant resin layer 10 and the flexible resin layer 20 before a pick-up step of electronic components 70, a peel strength $P_0$ between the heat-resistant resin layer 10 and the flexible resin layer 20, which is based on JIS 20237 and measured using a method described below, is equal to or more than 0.01 N/25 mm and equal to or less than 2.0 N/25 mm. In addition, in the adhesive laminate film 50 according to the present embodiment, from the viewpoint of a capability of favorably peeling off the heat-resistant resin layer 10 from the flexible resin layer 20 after a characteristic evaluation step of the electronic components 70, a peel strength $P_1$ between the heat-resistant resin layer 10 and the flexible resin layer 20 after a thermal treatment of the adhesive laminate film 50 at 160° C. for four hours, which is based on JIS 20237 and measured using the method described below, is equal to or more than 0.05 N/25 mm and equal to or less than 1.5 N/25 mm.

(Method for Measuring Peel Strength)

The adhesive laminate film 50 is attached to a silicon wafer so that the adhesive resin layer 30 comes into contact with the silicon wafer. Next, the heat-resistant resin layer 10 is peeled off from the flexible resin layer 20 using a tensile tester in a 180-degree direction under conditions of 25° C. and a tensile rate of 300 mm/minute, a strength (N/25 mm) at this time is measured twice, and an average value is regarded as the peel strength.

The present inventors repeated intensive studies in order to realize a film capable of simplifying the characteristic evaluation step of electronic components and capable of accurately picking up electronic components. As a result, it was found that a method in which, as a film that temporarily fixes an electronic component, an adhesive laminate film having a heat-resistant resin layer, a flexible resin layer, and an adhesive resin layer in this order is used, and the heat-resistant resin layer is peeled off before a pick-up step of the electronic components is effective as a method for satisfying both the simplification of the characteristic evaluation step of electronic components and a property of picking up electronic components.

In addition, as a result of carrying out additional intensive studies on the basis of the above-described finding, the present inventors found for the first time that the adhesive laminate film 50 in which the peel strength $P_0$ and the peel strength $P_1$ between the heat-resistant resin layer 10 and the flexible resin layer 20 are in the above-described ranges enables the favorable peeling of the heat-resistant resin layer 10 from the flexible resin layer 20 after the characteristic evaluation step of the electronic components 70 while maintaining the adhesiveness between the heat-resistant resin layer 10 and the flexible resin layer 20 before the pick-up step of the electronic components 70.

That is, in the adhesive laminate film 50 according to the present embodiment, when the peel strength $P_0$ between the heat-resistant resin layer 10 and the flexible resin layer 20 is set to be equal to or more than the above-described lower limit value, it becomes possible to favorably maintain the adhesiveness between the heat-resistant resin layer 10 and the flexible resin layer 20 before the pick-up step of the electronic components 70.

In addition, in the adhesive laminate film 50 according to the present embodiment, when the peel strength $P_1$ between the heat-resistant resin layer 10 and the flexible resin layer 20 is set to be equal to or less than the above-described upper limit value, it is possible to favorably peel off the heat-resistant resin layer 10 from the flexible resin layer 20 after the characteristic evaluation step of the electronic components 70.

In the adhesive laminate film 50 according to the present embodiment, the peel strength $P_0$ between the heat-resistant resin layer 10 and the flexible resin layer 20 is equal to or more than 0.01 N/25 mm and equal to or less than 2.0 N/25 mm, but preferably equal to or more than 0.02 N/25 mm and more preferably equal to or more than 0.04 N/25 mm, and preferably equal to or less than 1.5 N/25 mm, more preferably equal to or less than 1.0 N/25 mm, still more preferably equal to or less than 0.5 N/25 mm, and particularly preferably equal to or less than 0.3 N/25 mm.

In addition, in the adhesive laminate film 50 according to the present embodiment, the peel strength $P_1$ between the heat-resistant resin layer 10 and the flexible resin layer 20 is equal to or more than 0.05 N/25 mm and equal to or less than 1.5 N/25 mm, but preferably equal to or less than 1.0 N/25 mm, more preferably equal to or less than 0.7 N/25 mm, and particularly preferably equal to or less than 0.5 N/25 mm and preferably equal to or more than 0.08 N/25 mm and more preferably equal to or less than 0.10 N/25 mm.

The peel strength $P_0$ and the peel strength $P_1$ between the heat-resistant resin layer 10 and the flexible resin layer 20 can be controlled in the above-described ranges by, for example, providing an adhesive layer described below between the heat-resistant resin layer 10 and the flexible resin layer 20 or carrying out a surface treatment on a surface of the heat-resistant resin layer 10.

In the present embodiment, the peel strength $P_0$ and the peel strength $P_1$ between the heat-resistant resin layer 10 and the flexible resin layer 20 can be controlled in the above-described ranges by appropriately adjusting, for example, (1) the types or proportions blended of individual components of the adhesive layer, (2) the types or proportions contained of individual monomers in an adhesive resin that configures the adhesive layer, and the like.

Among these, for example, the type, proportion blended, or the like of a crosslinking agent in the adhesive resin that configures the adhesive layer is exemplified as an element for setting the peel strength $P_0$ and the peel strength $P_1$ between the heat-resistant resin layer 10 and the flexible resin layer 20 in desired numerical ranges.

A thickness of the entire adhesive laminate film 50 according to the present embodiment is preferably equal to or more than 25 μm and equal to or less than 1100 μm, more preferably equal to or more than 30 μm and equal to or less than 700 μm, and still more preferably equal to or more than 30 μm and equal to or less than 500 μm from the viewpoint of the balance between the mechanical characteristics and the handleability.

The adhesive laminate film 50 according to the present embodiment can be used as a film or the like for temporarily fixing electronic components in a step of manufacturing an electronic device and, particularly, can be preferably used as dicing tape.

A total light transmittance of the adhesive laminate film 50 according to the present embodiment is preferably equal to or more than 80% and more preferably equal to or more than 85%. In such a case, it is possible to impart transparency to the adhesive laminate film 50. In addition, when the total light transmittance of the adhesive laminate film 50 is set to be equal to or more than the above-described lower limit value, it is possible to more effectively irradiate the adhesive resin layer 30 with radioactive rays and improve the radioactive ray irradiation efficiency. Meanwhile, the total light transmittance of the adhesive laminate film 50 can be measured on the basis of JIS K7105 (1981).

Next, the respective layers that configure the adhesive laminate film 50 according to the present embodiment will be described.

Here, in the present embodiment, heat resistance refers to the dimensional stability of a film or a resin layer at a high temperature or a low temperature. That is, a film or a resin layer being excellent in terms of heat resistance means that the film or the resin layer does not easily deform (expand, contract, soften, or the like), melt, or the like at a high temperature or a low temperature.

<Heat-Resistant Resin Layer>

The heat-resistant resin layer 10 is a layer that is provided for the purpose of making the characteristics such as handleability, mechanical characteristics, heat resistance, and the like of the adhesive laminate film 50 more favorable.

The heat-resistant resin layer 10 is not particularly limited as long as the heat-resistant resin layer is heat-resistant enough to prevent the occurrence of deformation or melting which causes the positional deviation of the electronic components 70 at the time of evaluating the characteristics of the electronic components 70 at a high temperature or a low temperature, and it is possible to use, for example, heat-resistant resin films.

As a resin that configures the heat-resistant resin film, for example, one or more selected from polyesters such as polyethylene terephthalate, polybutylene terephthalate, polyethylene naphthalate, and the like; polyamides such as nylon-6, nylon-66, polymetaxylene adipamide, and the like; polyimides; polyether imides; polyamide-imide; polycarbonates; modified polyphenylene ethers; polyacetals; polyacrylates; polysulfones; polyether sulfones; polyphenylene sulfides; polyether ether ketones; fluororesins; liquid crystal polymers; vinylidene chloride resins; polybenzimidazole; polybenzoxazole; polymethylpentene; and the like can be exemplified.

Among these, one or more selected from polyimides, polyamides, and polyesters are preferred from the viewpoint of the excellent balance among heat resistance, mechanical characteristics, transparency, prices, and the like.

A melting point of the heat-resistant resin layer 10 is preferably equal to or higher than 200° C. and more preferably equal to or higher than 220° C. Alternatively, the heat-resistant resin layer 10 preferably exhibits no melting point, and a decomposition temperature is preferably equal to or higher than 200° C., and the decomposition temperature is more preferably equal to or higher than 220° C.

When the above-described heat-resistant resin layer 10 is used, it is possible to further suppress the deformation of the adhesive laminate film 50 at the time of evaluating the characteristics of the electronic components 70 at a high temperature or a low temperature.

The heat-resistant resin layer 10 may be a single layer or a multiple layer.

In addition, a form of a resin film that is used to form the heat-resistant resin layer 10 may be a stretched film or may be a film stretched in a monoaxial direction or a biaxial direction; however, from the viewpoint of improving the heat resistance and the mechanical strength of the heat-resistant resin layer 10, a film stretched in a monoaxial direction or a biaxial direction is preferred.

A thickness of the heat-resistant resin layer 10 is preferably equal to or more than 10 μm and equal to or less than 1,000 μm, more preferably equal to or more than 10 μm and equal to or less than 500 μm, and still more preferably equal to or more than 20 μm and equal to or less than 300 μm from the viewpoint of obtaining favorable film characteristics.

In order to improve the adhesiveness with other layers, a surface treatment may be carried out on the heat-resistant resin layer 10. Specifically, a corona treatment, a plasma treatment, an undercoat treatment, a primer coat treatment, or the like may be carried out.

The heat-resistant resin layer 10 is peelably laminated on the flexible resin layer 20.

A method for peelably laminating the heat-resistant resin layer is not particularly limited, and examples thereof include a method in which the heat-resistant resin layer is laminated through a peelable adhesive layer (not shown), a method in which a surface roughness of the surface of the heat-resistant resin layer 10 which comes into contact with the flexible resin layer 20 is adjusted and a mold release treatment is carried out on the surface, and the like.

That is, the adhesive laminate film 50 according to the present embodiment preferably further has an adhesive layer between the heat-resistant resin layer 10 and the flexible resin layer 20 from the viewpoint of further facilitating the adjustment of the peel strength between the heat-resistant resin layer 10 and the flexible resin layer 20.

As the above-described peelable adhesive layer, for example, (1) an adhesive layer configured of a heating thermal expansion-type adhesive that is expanded by heating and is capable of suppressing an increase in the adhesive force, (2) an adhesive layer configured of a double sided adhesive film for which a contractible film that is contracted by heating and is capable of suppressing an increase in the adhesive force is used as a base material, (3) a heat-resistant adhesive layer capable of suppressing an increase in the adhesive force even after a treatment at a high temperature or a low temperature, and the like.

((1) Adhesive Layer Configured of Heating Thermal Expansion-Type Adhesive that is Expanded by Heating and is Capable of Suppressing Increase in Adhesive Force)

The heating thermal expansion-type adhesive refers to an adhesive containing thermally expansible fine particles, a foaming agent, or the like dispersed in an adhesive layer. As the adhesive, it is possible to generally use well-known adhesives, and examples thereof include (meth)acrylic adhesives, silicone-based adhesives, rubber-based adhesives, polyurethane-based adhesives, polyvinyl ether-based adhesives, and the like.

As the thermally expansible fine particles, for example, fine particles obtained by enclosing a substance that is easily gasified and expanded by heating such as isobutene, propane, pentane, or the like in an elastic shell are exemplified.

As the foaming agent, for example, chemical substances that can be thermally decomposed to generate water, carbon dioxide, and nitrogen and the like are exemplified.

When the thermally expansible fine particles or the foaming agent are expanded by heating, the surface state of the adhesive layer changes, an increase in the adhesive force between the heat-resistant resin layer 10 and the flexible resin layer 20 can be suppressed, and consequently, it is possible to easily peel off the heat-resistant resin layer 10 from the flexible resin layer 20.

((2) Adhesive Layer Configured of Double Sided Adhesive Film for which Contractible Film that is Contracted by Heating and is Capable of Suppressing Increase in Adhesive Force is Used as Base Material)

As the contractible film that is used for the double sided adhesive film for which the contractible film is used as a base material, thermal contractible films that are contracted by heating are exemplified. Examples thereof include monoaxially or biaxially stretched films of polyethylene terephthalate, polyethylene, polystyrene, polypropylene, polyamide, polyurethane, polyvinyl chloride, polyvinylidene chloride, or the like and the like.

As an adhesive that is provided on both surfaces of the contractible film, it is possible to generally use, for example, well-known adhesives, and examples thereof include (meth)acrylic adhesives, silicone-based adhesives, rubber-based adhesives, polyurethane-based adhesives, polyvinyl ether-based adhesives, and the like.

When the contractible film as the base material is contracted by heating, the surface state of the adhesive layer changes, an increase in the adhesive force between the heat-resistant resin layer 10 and the flexible resin layer 20 can be suppressed, and consequently, it is possible to easily peel off the heat-resistant resin layer 10 from the flexible resin layer 20.

((3) Heat-Resistant Adhesive Layer Capable of Suppressing Increase in Adhesive Force Even after Treatment at High Temperature or Low Temperature)

As an adhesive that configures the heat-resistant adhesive layer capable of suppressing an increase in the adhesive force even after a treatment at a high temperature or a low temperature, (meth)acrylic adhesives, silicone-based adhesives, urethane-based adhesives, olefin-based adhesives, styrene-based adhesives, and the like are exemplified.

Here, the (meth)acrylic adhesive includes a (meth)acrylic adhesive resin as an essential component. The silicone-based adhesive includes a silicone-based adhesive resin as an essential component. The urethane-based adhesive includes a urethane-based adhesive resin as an essential component.

Among these, the (meth)acrylic adhesives are preferred from the viewpoint of further facilitating the adjustment of the peel strength between the heat-resistant resin layer 10 and the flexible resin layer 20.

As the (meth)acrylic adhesive resin that is used in the (meth)acrylic adhesive, for example, copolymers including a (meth)acrylic acid alkyl ester monomer unit (A) and a monomer unit (B) having a functional group capable of reacting with a crosslinking agent are exemplified.

In this embodiment, the (meth)acrylic acid alkyl ester means acrylic acid alkyl ester, methacrylic acid alkyl ester, or a mixture thereof.

The (meth)acrylic adhesive resin according to the present embodiment can be obtained by, for example, copolymerizing a monomer mixture including the (meth)acrylic acid alkyl ester monomer unit (A) and the monomer unit (B) having a functional group capable of reacting with a crosslinking agent.

As a monomer (A) that forms the (meth)acrylic acid alkyl ester monomer unit (A), (meth)acrylic acid alkyl esters having an alkyl group having approximately 1 to 12 carbon atoms are exemplified. Preferred are (meth)acrylic acid alkyl esters having an alkyl group having approximately 1 to 8 carbon atoms. Specifically, methyl acrylate, methyl methacrylate, ethyl acrylate, ethyl methacrylate, butyl acrylate, butyl methacrylate, 2-ethylhexyl acrylate, 2-ethylhexyl methacrylate, and the like are exemplified. These (meth)acrylic acid alkyl esters may be used singly or two or more (meth)acrylic acid alkyl esters may also be used.

In the (meth)acrylic adhesive resin according to the present embodiment, a content of the (meth)acrylic acid alkyl ester monomer unit (A) is preferably equal to or more than 10% by mass and equal to or less than 98.9% by mass and more preferably equal to or more than 85% by mass and equal to or less than 95% by mass when the total of all monomer units in the (meth)acrylic adhesive resin is set to 100% by mass.

A monomer (B) that forms the monomer unit (B) having a functional group capable of reacting with a crosslinking agent is acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, or the like. These monomers may be used singly or two or more monomers may also be used.

In the (meth)acrylic adhesive resin according to the present embodiment, a content of the monomer (B) is preferably equal to or more than 1% by mass and equal to or less than 40% by mass, more preferably equal to or more than 1% by mass and equal to or less than 20% by mass, and still more preferably equal to or more than 1% by mass and equal to or less than 10% by mass when the total of all of the monomer units in the (meth)acrylic adhesive resin is set to 100% by mass.

The (meth)acrylic adhesive resin according to the present embodiment preferably further includes, in addition to the monomer unit (A) and the monomer unit (B), a polyfunctional monomer-derived configurational unit (C) having two or more carbon-carbon double bonds in the molecule (hereinafter, also referred to as the polyfunctional monomer unit (C)) or a specific comonomer (hereinafter, referred to as the polymerizable surfactant) unit having a property as a surfactant. Particularly, from the viewpoint of further improving the balance with the heat resistance or the adhesive force of the adhesive layer, the (meth)acrylic adhesive resin according to the present embodiment preferably includes the polyfunctional monomer (C)-derived configurational unit (C).

The polymerizable surfactant has a property of being copolymerized with the monomer (A), the monomer (B), and the monomer (C) and has an action as an emulsifier in the case of emulsion polymerization.

As the monomer (C) that forms the polyfunctional monomer unit (C), allyl methacrylate, allyl acrylate, divinylbenzene, vinyl methacrylate, vinyl acrylate, trimethylolpropane tri(meth)acrylate, dipentaerythritol hexa(meth)acrylate, tetraethylene glycol di(meth)acrylate, 1,6-hexanediol di(meth)acrylate, neopentyl glycol di(meth)acrylate, dipentaerythritol hexa(meth)acrylate, 2-propenyl di-3-butenyl cyanurate, 2-hydroxyethyl bis(2-(meth)acryloxyethyl) isocyanurate, tris(2-methacryloxyethyl) isocyanurate, for example, monomers in which both terminals are diacrylate or dimethacrylate and the structure of a main chain is propylene glycol (hereinafter, also referred to as polypropylene glycol di(meth)acrylate) (for example, manufactured by NOF Corporation, trade names; PDP-200, PDP-400, ADP-200, and ADP-400), monomers in which both terminals are diacrylate or dimethacrylate and the structure of a main chain is tetramethylene glycol (hereinafter, also referred to as polytetramethylene glycol di(meth)acrylate) (for example, manufactured by NOF Corporation, trade names; ADT-250 and ADT-850), mixtures thereof (for example, manufactured by NOF Corporation, trade names; ADET-1800 and ADPT-4000), and the like are exemplified.

These monomers may be used singly or two or more monomers may be jointly used. Among these, from the viewpoint of further improving the balance with the heat resistance or the adhesive force of the adhesive layer, one or more selected from polypropylene glycol di(meth)acrylate and polytetramethylene glycol di(meth)acrylate are preferably included, and polytetramethylene glycol di(meth)acrylate is more preferred.

In the (meth)acrylic adhesive resin according to the present embodiment, a content of the monomer (C) is preferably equal to or more than 0.1% by mass and equal to or less than 30% by mass and more preferably equal to or more than 0.1% by mass and equal to or less than 5% by mass when the total of all of the monomer units in the (meth)acrylic adhesive resin is set to 100% by mass.

Examples of the polymerizable surfactant include surfactants obtained by introducing a polymerizable 1-propenyl group into a benzene ring of polyoxyethylene nonylphenyl ether (manufactured by DKS Co., Ltd.; trade names: AQUARON RN-10, AQUARON RN-20, AQUARON RN-30, AQUARON RN-50, and the like), surfactants obtained by introducing a polymerizable 1-propenyl group into a benzene ring of an ammonium salt of a sulfuric acid ester of polyoxyethylene nonylphenyl ether (manufactured by DKS Co., Ltd.; trade names: AQUARON HS-10, AQUARON HS-20, AQUARON HS-1025, and the like), sulfosuccinic acid diester-based surfactants having a polymerizable double bond in the molecule (manufactured by KAO Corporation; trade names: LATEMUL S-120A, LATEMUL S-180A, and the like), and the like.

The (meth)acrylic adhesive resin according to the present embodiment may further contain a monomer unit formed of a monomer having a polymerizable double bond such as vinyl acetate, acrylonitrile, styrene, or the like as necessary.

As a polymerization reaction mechanism of the (meth)acrylic adhesive resin according to the present embodiment, radical polymerization, anionic polymerization, cationic polymerization, and the like are exemplified. When the manufacturing cost of the (meth)acrylic adhesive resin, the influence of the functional group in the monomer, and the like are taken into account, the (meth)acrylic adhesive resin is preferably polymerized by radical polymerization.

When the (meth)acrylic adhesive resin is polymerized by radical polymerization, as a radical polymerization initiator, organic peroxides such as benzoyl peroxide, di-t-butyl peroxide, dicumyl peroxide, 3,3,5-trimethylhexanoyl peroxide, di-2-ethylhexyl peroxydicarbonate, methyl ethyl ketone peroxide, t-butyl peroxy phthalate, t-butyl peroxybenzoate, di-t-butyl peroxyacetate, t-butylperoxy isobutyrate, t-butylperoxy-2-hexanoate, t-butylperoxy-2-ethylhexanoate, t-butyl peroxy-3,5,5-trimethyl hexanoate, acetyl peroxide, isobutyryl peroxide, octanoyl peroxide, t-butyl peroxide, di-t-amyl peroxide, and the like; inorganic peroxides such as ammonium persulfate, potassium persulfate, sodium persulfate, and the like; and azo compounds such as 2,2'-azobisisobutyronitrile, 2,2'-azobis-2-methylbutyronitrile, 4,4'-azobis-4-cyanovaleric acid, and the like are exemplified.

In a case where the (meth)acrylic adhesive resin is polymerized using an emulsion polymerization method, among these radical polymerization initiators, inorganic peroxides such as ammonium persulfate, potassium persulfate, sodium persulfate, and the like that are water-soluble and azo compounds having a carboxyl group in the molecule such as 4,4'-azobis-4-cyanovaleric acid that is, similarly, water-soluble are preferred, ammonium persulfate and azo compounds having a carboxyl group in the molecule such as 4,4'-azobis-4-cyanovaleric acid are more preferred, and azo compounds having a carboxyl group in the molecule such as 4,4'-azobis-4-cyanovaleric acid are particularly preferred.

The (meth)acrylic adhesive preferably further includes, in addition to the (meth)acrylic adhesive resin, a crosslinking agent having two or more crosslinking functional groups in a molecule.

The crosslinking agent having two or more crosslinking functional groups in a molecule is used to adjust the adhesive force and the cohesive force by reacting the crosslinking agent with the functional group in the (meth)acrylic adhesive resin.

As the above-described crosslinking agent, epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcinyldiglycidyl ether, and the like; isocyanate-based compounds such as tetramethylene diisocyanate, hexamethylene diisocyanate, toluene diisocyanate triadducts of trimethylol propane, polyisocyanate, diphenylmethane diisocyanate, tolylene diisocyanate, and the like; aziridine-based compounds such as trimethylolpropane tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-aziridinecarboxyamide), N,N'-toluene-2,4-bis(1-aziridinecarboxyamide), trimethylolpropane-tri-β-(2-methylaziridine) propionate, and the like; tetrafunctional epoxy-based compounds such as N,N,N'N'-tetraglydicyl-m-xylenediamine, 1,3-bis(N,N'-diglydicylaminomethyl)cyclohexane, and the like; melamine-based compounds such as hexamethoxymethylol melamine and the like; and the like are exemplified. These crosslinking agents may be used singly or two or more crosslinking agents may be jointly used.

Among these, one or more selected from the epoxy-based compounds, the isocyanate-based compounds, and the aziridine-based compounds are preferably included, and, from the viewpoint of from the viewpoint of further improving the balance with the heat resistance or the adhesive force of the adhesive layer, the epoxy-based compound is more preferred.

A content of the crosslinking agent in the (meth)acrylic adhesive is preferably equal to or more than 5 parts by mass, more preferably equal to or more than 8 parts by mass, still more preferably equal to or more than 10 parts by mass, and particularly preferably equal to or more than 12 parts by mass and is preferably equal to or less than 50 parts by mass and more preferably equal to or less than 30 parts by mass with respect to 100 parts by mass of the (meth)acrylic adhesive resin from the viewpoint of improving the balance with the heat resistance or the adhesive force of the adhesive layer.

In addition, when the content of the crosslinking agent in the (meth)acrylic adhesive is adjusted, it is possible to adjust the peel strength $P_0$ and the peel strength $P_1$ between the heat-resistant resin layer 10 and the flexible resin layer 20.

The (meth)acrylic adhesive according to the present embodiment may further include, in addition to the adhesive resin, an ultraviolet polymerization initiator. In such a case, it is possible to shorten a curing time by irradiation with ultraviolet rays and decrease the irradiation amount with ultraviolet rays.

Examples of the ultraviolet polymerization initiator include an acetophenone-based photopolymerization initiator such as methoxyacetophenone and the like; an α-ketol compound such as 4-(2-hydroxyethoxy)phenyl (2-hydroxy-2-propyl) ketone, or the like; a benzoin-based photopolymerization initiator such as benzoin, benzoin methyl ether, benzoin ethyl ether, benzoin isopropyl ether, or the like; a benzophenone-based photopolymerization initiator such as benzophenone and benzoylbenzoic acid; and the like.

A content of the ultraviolet polymerization initiator in the adhesive is preferably equal to or more than 0.1 parts by mass and equal to or less than 10 parts by mass and more preferably equal to or more than 2.5 parts by mass and equal to or less than 5 parts by mass with respect to 100 parts by mass of the adhesive resin.

A thickness of the adhesive layer is not particularly limited, but is preferably equal to or more than 1 μm and equal to or less than 100 μm and more preferably equal to or more than 3 μm and equal to or less than 50 μm.

The adhesive layer can be formed by applying an adhesive coating fluid onto the heat-resistant resin layer 10 or the flexible resin layer 20.

As a method for applying the adhesive coating fluid, it is possible to employ a well-known application method of the related art, for example, a roll coater method, a reverse roll coater method, a gravure roll method, a bar coater method, a comma coater method, a die coater method, or the like. Drying conditions of the applied adhesive are not particularly limited; however, generally, the adhesive is preferably dried in a temperature range of 80° C. to 200° C. for 10 seconds to 10 minutes and more preferably dried at 80° C. to 170° C. for 15 seconds to 5 minutes. In order to sufficiently accelerate a crosslinking reaction between the crosslinking agent and the adhesive, the adhesive coating fluid may be heated at 40° C. to 80° C. for 5 to 300 hours after the end of the drying of the adhesive coating fluid.

In addition, in the adhesive laminate film 50 according to the present embodiment, the peel strength between the heat-resistant resin layer 10 and the flexible resin layer 20 can also be adjusted by adjusting the surface roughness of the surface of the heat-resistant resin layer 10 which comes into contact with the flexible resin layer 20 and carrying out a mold release treatment on the surface.

Here, the surface roughness (Ra) of the surface of the heat-resistant resin layer 10 which comes into contact with the flexible resin layer 20, which is regulated by JIS-B0601, is preferably equal to or more than 0.10 μm and equal to and less than 10 μm.

In addition, a mold release treatment is preferably carried out on the surface of the heat-resistant resin layer 10 which comes into contact with the flexible resin layer 20 using a mold release agent such as silicone, polytetrafluoroethylene, or the like.

<Flexible Resin Layer>

The flexible resin layer 20 is a layer that is provided for the purpose of making the characteristics such as flexibility, a stretch property, and the like of the adhesive laminate film 50 more favorable.

When the flexible resin layer 20 is provided, the stretch property or the flexibility of the adhesive laminate film 50 improves, and it is possible to more easily expand the adhesive laminate film 50 in the in-plane direction in the step of picking up the electronic components 70.

The flexible resin layer 20 is not particularly limited as long as the flexible resin layer can be expanded in the in-plane direction, but is preferably a flexible resin layer that is excellent in terms of characteristics such as flexibility, a stretch property, and the like and is heat-resistant enough to maintain the adhesiveness with the adhesive resin layer 30 at the time of evaluating the characteristics of the electronic components 70 at a high temperature or a low temperature.

As a flexible resin that configures the flexible resin layer 20, for example, one or more selected from a polyester-based elastomer, a polyamide-based elastomer, a polyimide-based elastomer, and a polybutylene terephthalate are exemplified.

A tensile elastic modulus (E') of the flexible resin layer 20 at 160° C., which is based on JIS K7161 and measured under conditions of a sample width of 10 mm, an inter-chuck distance of 30 mm, and a tensile rate of 300 mm/minute, is preferably equal to or more than 1 MPa and equal to or less than 300 MPa and more preferably equal to or more than 5 MPa and equal to or less than 150 MPa. In such a case, it is possible to further suppress the thermal expansion of the adhesive laminate film 50 at the time of evaluating the characteristics of the electronic components 70 at a high temperature or a low temperature while favorably maintaining the characteristics such as flexibility, a stretch property, and the like of the flexible resin layer 20.

A melting point of the flexible resin layer 20 is preferably equal to or higher than 100° C. and equal to or lower than 250° C.

When the flexible resin layer 20 as described above is used, it is possible to further suppress the thermal expansion of the adhesive laminate film 50 at the time of evaluating the characteristics of the electronic components 70 at a high temperature or a low temperature.

A thickness of the flexible resin layer 20 is not particularly limited, but is, for example, preferably equal to or more than 10 μm and equal to or less than 500 μm, more preferably equal to or more than 20 μm and equal to or less than 300 μm, still more preferably equal to or more than 30 μm and equal to or less than 250 μm, and particularly preferably equal to or more than 50 μm and equal to or less than 200 μm.

<Adhesive Resin Layer>

The adhesive resin layer 30 is a layer that is brought into contact with and adhered to the electronic components 70 at the time of attaching the adhesive laminate film 50 to the electronic components 70.

As an adhesive that configures the adhesive resin layer 30, a (meth)acrylic adhesive, a silicone-based adhesive, an urethane-based adhesive, a styrene-based adhesive, and the like are exemplified. Among these, the (meth)acrylic adhesive containing a (meth)acrylic polymer as a base polymer is preferred since the adjustment of the adhesive force can be easily adjusted.

As the adhesive that configures the adhesive resin layer 30, it is possible to use a radioactive ray-crosslinkable adhesive that decreases the adhesive force using radioactive rays. When the adhesive resin layer 30 configured of the radioactive ray-crosslinkable adhesive is crosslinked by the irradiation with radioactive rays, the adhesive force significantly decreases, and thus it becomes easy to pick up the electronic components 70 from the adhesive resin layer 30 in the pick-up step of the electronic components 70.

As the radioactive ray-crosslinkable adhesive, an ultraviolet ray-crosslinkable adhesive is preferred.

As the (meth)acrylic polymer that is included in the (meth)acrylic adhesive, for example, homopolymers of a (meth)acrylic acid ester compound, copolymers of a (meth)acrylic acid ester compound and a comonomer, and the like. Examples of the (meth)acrylic acid ester compound include methyl (meth)acrylate, ethyl (meth)acrylate, butyl (meth)acrylate, 2-ethylhexyl (meth)acrylate, hydroxyethyl (meth)acrylate, hydroxypropyl (meth)acrylate, dimethylaminoethyl (meth)acrylate, glycidyl (meth)acrylate, and the like. These (meth)acrylic acid ester compounds may be used singly or two or more (meth)acrylic acid ester compounds may be jointly used.

In addition, examples of the comonomer that configures the (meth)acrylic copolymer include vinyl acetate, (meth) acrylonitrile, (meth)acrylamide, styrene, (meth)acrylic acid, itaconic acid, (meth)acrylamide, methylol (meth)acrylamide, maleic anhydride, and the like. These comonomers may be used singly or two or more comonomers may be jointly used.

The radioactive ray-crosslinkable adhesive includes, for example, an adhesive such as the above-described (meth) acrylic adhesive or the like, a crosslinkable compound (a component having a carbon-carbon double bond), and a photopolymerization initiator or a thermal polymerization initiator.

Examples of the crosslinkable compound include monomers, oligomers, polymers, and the like which have a carbon-carbon double bond and can be crosslinked by radical polymerization. Examples of the above-described crosslinkable compound include esters of (meth)acrylic acid and a polyhydric alcohol such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, dipentaerythritol hexa(meth)acrylate, and the like; ester (meth)acrylate oligomers; isocyanurates such as 2-propenyl di-3-butenyl cyanurate, 2-hydroxyethyl bis(2-(meth)acryloxyethyl) isocyanurate, tris(2-methacryloxyethyl) isocyanurate, and the like or isocyanurate compounds, and the like.

Meanwhile, in a case where the adhesive is a radioactive ray-crosslinkable adhesive having a carbon-carbon double bond in a side chain of the polymer, the crosslinkable compound may not be added thereto.

A content of the crosslinkable compound is preferably 5 to 100 parts by mass and more preferably 10 to 50 parts by mass with respect to 100 parts by mass of the adhesive resin. When the content of the crosslinkable compound is in the above-described range, the adjustment of the adhesive force becomes easier compared with a case where the content is below the above-described range and it becomes more difficult for the storage stability to be degraded by an excessively high sensitivity to heat or light.

The photopolymerization initiator needs to be a compound that is cleaved by the irradiation with radioactive rays and generates radicals, and examples thereof include benzoin alkyl ethers such as benzoin methyl ether, benzoin isopropyl ether, benzoin isobutyl ether, and the like; aromatic ketones such as benzyl, benzoin, benzophenone, α-hydroxycyclohexyl phenyl ketone, and the like; aromatic ketals such as benzyl dimethyl ketal; polyvinyl benzophenone; thioxanthones such as chlorothioxanthone, dodecylthioxanthone, dimethylthioxanthone, diethylthioxanthone, and the like, and the like.

As the thermal polymerization initiator, for example, organic peroxide derivatives, azo-based polymerization initiators, and the like are exemplified. The organic peroxide derivatives are preferred since no nitrogen is generated during heating. Examples of the thermal polymerization initiator include ketone peroxide, peroxyketal, hydroperoxide, dialkyl peroxide, diacyl peroxide, peroxyester, peroxydicarbonate, and the like.

A crosslinking agent may be added to the adhesive. As the crosslinking agent, for example, epoxy-based compounds such as sorbitol polyglycidyl ether, polyglycerol polyglycidyl ether, pentaerythritol polyglycidyl ether, diglycerol polyglycidyl ether, and the like; aziridine compounds such as tetramethylolmethane-tri-β-aziridinyl propionate, trimethylolpropane tri-β-aziridinyl propionate, N,N'-diphenylmethane-4,4'-bis (1-aziridinecarboxamide), N,N'-hexamethylene-1,6-bis(1-aziridinecarboxamido), and the like; isocyanate compounds such as tetramethylene diisocyanate, hexamethylene diisocyanate, polyisocyanate, and the like, and the like are exemplified. The crosslinking agents may be used singly or two or more crosslinking agents may be used in combination. A content of the crosslinking agent is preferably equal to or more than 0.1 parts by mass and equal to or less than 10 parts by mass with respect to 100 parts by mass of the (meth)acrylic adhesive resin from the viewpoint of improving the balance with the heat resistance or the adhesive force of the adhesive resin layer 30.

A thickness of the adhesive resin layer 30 is not particularly limited, but is, for example, preferably equal to or more than 1 μm and equal to or less than 100 μm and more preferably equal to or more than 3 μm and equal to or less than 50 μm.

The adhesive resin layer 30 can be formed by applying an adhesive coating fluid onto a base material layer or the flexible resin layer 20.

As a method for applying the adhesive coating fluid, it is possible to employ a well-known application method of the related art, for example, a roll coater method, a reverse roll coater method, a gravure roll method, a bar coater method, a comma coater method, a die coater method, or the like. Drying conditions of the applied adhesive are not particularly limited; however, generally, the adhesive is preferably dried in a temperature range of 80° C. to 200° C. for 10 seconds to 10 minutes and more preferably dried at 80° C. to 170° C. for 15 seconds to 5 minutes. In order to sufficiently accelerate a crosslinking reaction between the crosslinking agent and the adhesive, the adhesive coating fluid may be heated at 40° C. to 80° C. for 5 to 300 hours after the end of the drying of the adhesive coating fluid.

<Other Layers>

In the adhesive laminate film 50 according to the present embodiment, a mold release film may be further laminated on the adhesive resin layer 30. As the mold release film, a polyester film on which a mold release treatment has been carried out and the like are exemplified.

<Method for Manufacturing Adhesive Laminate Film>

Next, an example of a method for manufacturing the adhesive laminate film 50 according to the present embodiment will be described.

The adhesive laminate film 50 according to the present embodiment can be obtained by, for example, forming the flexible resin layer 20 on one surface of the heat-resistant resin layer 10 using an extrusion laminate method and applying and drying the adhesive coating fluid onto the flexible resin layer 20 to form the adhesive resin layer 30.

In addition, the heat-resistant resin layer 10 and the flexible resin layer 20 may be formed by co-extrusion molding or a film-like heat-resistant resin layer 10 and a film-like flexible resin layer 20 may be laminated and formed.

2. Method for Manufacturing Electronic Device

Next, a method for manufacturing an electronic device according to the present embodiment will be described. FIG. 2 is a cross-sectional view schematically showing an example of a method for manufacturing an electronic device of an embodiment according to the present invention.

The method for manufacturing an electronic device according to the present embodiment includes, for example, at least four steps described below.

(A) A step of preparing a structure 100 including the adhesive laminate film 50 having the heat-resistant resin layer 10, the flexible resin layer 20, and the adhesive resin layer 30 in this order and one or more electronic components 70 attached onto the adhesive resin layer 30 of the adhesive laminate film 50, (B) A step of evaluating the characteristics of the electronic components 70 in a state of being attached onto the adhesive resin layer 30, (C) A step of peeling the heat-resistant resin layer 10 from the adhesive laminate film 50 after the step (B), and (D) A step of picking up the electronic components 70 from the adhesive resin layer 30 after the step (C).

In addition, in the method for manufacturing an electronic device according to the present embodiment, as the adhesive laminate film 50, the above-described adhesive laminate film 50 according to the present embodiment is used.

According to the present inventors' studies, regarding a method for manufacturing an electronic device of the related art, problems as described below were found.

First, the present inventors found that, in the method for manufacturing an electronic device of the related art, when the characteristics of electronic components are evaluated at a high temperature or a low temperature, an adhesive film that temporarily fix the electronic components deforms or melts. In this case, the positions of the electronic components on the adhesive film are deviated, and it becomes impossible to successfully pick up the electronic components afterwards.

Furthermore, according to the present inventors' studies, it was clarified that, when the heat resistance of the adhesive film is enhanced in order to suppress the deformation or melting of the adhesive film, the deformation or melting of the adhesive film is suppressed, and the positional deviation of the electronic components is redressed; however, conversely, the stretch property or flexibility of the adhesive film deteriorates, and it becomes impossible to successfully pick up the electronic components afterwards.

That is, for adhesive films of the related art, there was a room for improvement in a property of picking up electronic components after the evaluation of the characteristics of the electronic components at a high temperature or a low temperature.

Figure 3:
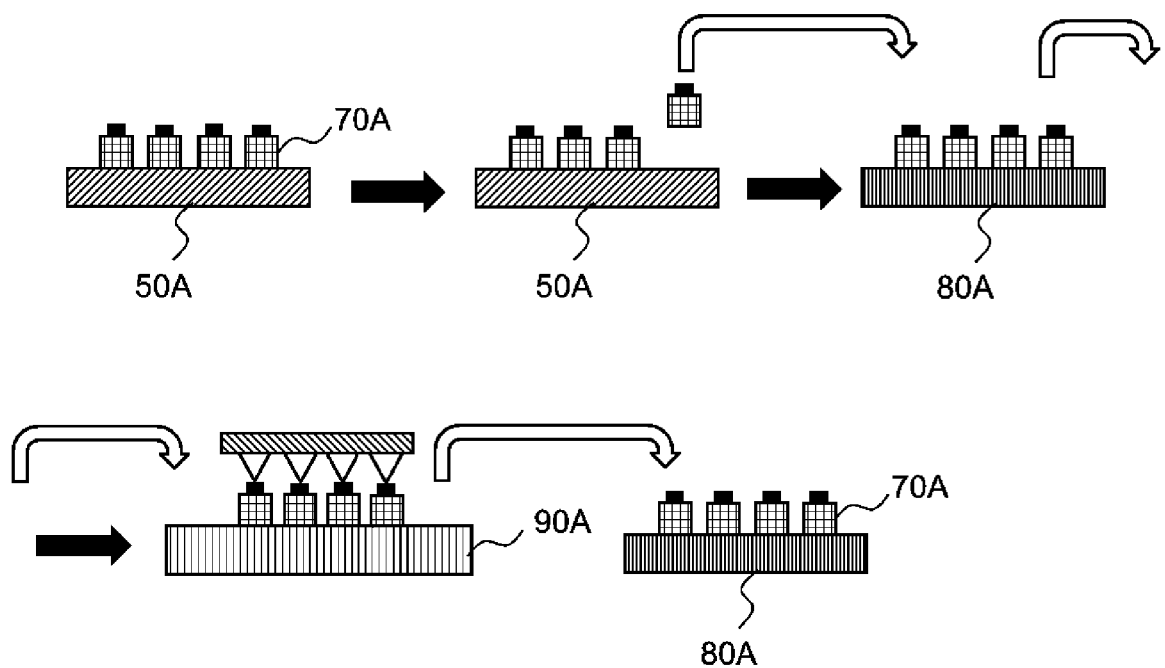
FIG. 3 is a cross-sectional view schematically showing an example of a method for manufacturing an electronic device of the related art.

Therefore, in the methods for manufacturing an electronic device of the related art, from the viewpoint of successfully picking up electronic components, as shown in FIG. 3, it is necessary to temporarily pick up electronic components 70A on an adhesive film 50A to a tray 80A or the like, then, again, move the electronic components 70A using a robot, dispose the electronic components on the stage 90A, evaluate the characteristics of the electronic components 70A at a high temperature or a low temperature, and then, again, move the electronic components 70A to the tray 80A or the like using the robot, which complicates steps.

That is, the present inventors found that there is a room for improvement for the methods for manufacturing an electronic device of the related art from the viewpoint of satisfying both the simplification of the characteristic evaluation step of electronic components and a property of picking up electronic components.

The present inventors repeated intensive studies in order to achieve the above-described object. As a result, the present inventors found that, when the adhesive laminate film 50 having the heat-resistant resin layer 10, the flexible resin layer 20, and the adhesive resin layer 30 in this order is used, and the heat-resistant resin layer 10 is peeled off before the pick-up step of the electronic components 70, it is possible to satisfy both the simplification of a characteristic evaluation step of the electronic components and a property of picking up the electronic component.

That is, when the step (B) is carried out using the adhesive laminate film 50 having the heat-resistant resin layer 10, the heat-resistant resin layer 10 suppresses the deformation or melting of the adhesive resin layer 30, which can suppress the positional deviation of the electronic components 70, and consequently, it is possible to more accurately pick up the electronic components 70 in the step (D).

In addition, the step (C) is carried out after the step (B), whereby the heat-resistant resin layer 10 having a poor stretch property and poor flexibility is removed, and thus, in the step (D), the stretch property and the flexibility of the film including the adhesive resin layer 30 and the flexible resin layer 20 become favorable, and it is possible to more easily carry out the pick-up of the electronic components 70 in the Step (D).

Furthermore, the characteristics of the electronic components 70 can be evaluated at a high temperature or a low temperature while the electronic components remain attached onto the adhesive laminate film 50, and thus it is not necessary to pick up the electronic components 70 from the adhesive laminate film 50 and move the electronic components to a tray or the like before the evaluation of the characteristics of the electronic components 70, and it is possible to simplify the characteristic evaluation step of the electronic components 70.

As described above, according to the method for manufacturing an electronic device according to the present embodiment, the steps (A) to (D) are provided, whereby it is possible to simplify the characteristic evaluation step of the electronic components 70, and it becomes possible to accurately pick up the electronic components 70.

Hereinafter, the respective steps of the method for manufacturing an electronic device according to the present embodiment will be described.

(Step (A))

In the beginning, the structure 100 including the adhesive laminate film 50 and one or more electronic components 70 attached onto the adhesive resin layer 30 of the adhesive laminate film 50 is prepared.

The above-described structure can be produced by, for example, attaching the electronic components 70 onto the adhesive resin layer 30 of the adhesive laminate film 50 and individualizing the electronic components 70 on the adhesive laminate film 50 as necessary.

Hereinafter, a method for manufacturing the structure 100 will be specifically described using a case where the electronic component 70 is a semiconductor substrate or a semiconductor chip as an example.

In the beginning, the semiconductor substrate is attached onto the adhesive resin layer 30 of the adhesive laminate film 50.

As the semiconductor substrate attached to the adhesive laminate film 50, for example, substrates (for example, wafers) made of silicon, germanium, gallium-arsenal, gallium-phosphorus, gallium-arsenal-aluminum, or the like are exemplified.

In addition, as the semiconductor substrate, a semiconductor substrate having a circuit formed on a surface is preferably used.

The adhesive laminate film 50 may be attached by human hands; however, in general, the adhesive laminate film is attached using an automatic attaching machine to which a roll-shaped surface protection film is attached.

The temperatures of the adhesive laminate film 50 and the semiconductor substrate during the attachment are not particularly limited, but are preferably 25° C. to 80° C.

In addition, the pressure of the adhesive laminate film 50 and the semiconductor substrate during the attachment are not particularly limited, but are preferably 0.3 MPa to 0.5 MPa.

Next, the semiconductor substrate on the adhesive laminate film 50 is diced to semiconductor chips.

"Dicing" mentioned herein refers to (a) an operation of providing notches as deep as the thickness of the semiconductor substrate to the semiconductor substrate to divide the semiconductor substrate and obtain a plurality of divided semiconductor chips (hereinafter, also referred to as "full-cut dicing") or (b) an operation of providing modified regions which are not deep enough to cut the semiconductor substrate to the semiconductor substrate by radiating laser light to obtain a plurality of semiconductor chips (hereinafter, also referred to as "stealth dicing").

The dicing can be carried out using a dicing blade (dicing saw), laser light, or the like.

In a case where the dicing is the full-cut dicing, the semiconductor substrate is divided into a plurality of semiconductor chips by the dicing.

On the other hand, in a case where the dicing is the stealth dicing, the semiconductor substrate is not divided into a plurality of semiconductor chips by the dicing alone, and the semiconductor substrate is divided by the expansion of the adhesive laminate film 50 after the dicing, whereby a plurality of divided semiconductor chips is obtained.

Meanwhile, both the plurality of divided semiconductor chips that is obtained by the full-cut dicing and the plurality of to-be-divided semiconductor chips that is obtained by the stealth dicing can be considered as the electronic components 70 in the step (A).

(Step (B))

Next, the characteristics of the electronic components 70 are evaluated in a state in which the electronic components are attached onto the adhesive resin layer 30.

The characteristic evaluation of the electronic components 70 is, for example, an operation confirmation test of the electronic components 70 and can be carried out using a probe card 92 having a probe terminal 95 as shown in FIG. 2.

For example, probe terminals 95 connected to a tester are brought into contact with terminals 75 of the electronic components 70 through the probe card 92. Therefore, operation power, operation test signals, and the like are traded between the electronic components 70 and the tester, and whether or not the operation characteristics of the electronic components 70 are favorable can be determined.

In the step (B), the characteristic evaluation of the electronic components 70 is preferably carried out in a temperature environment of equal to or lower than 0° C. or equal to or higher than 50° C. and equal to or lower than 200° C., the characteristic evaluation of the electronic components 70 is more preferably carried out in a temperature environment of equal to or higher than 60° C. and equal to or lower than 180° C., and the characteristic evaluation of the electronic components 70 is still more preferably carried out in a temperature environment of equal to or higher than 80° C. and equal to or lower than 160° C. In such a case, the deterioration of electronic components 70 having a potential cause for the generation of a defect can be accelerated, an initial defect of the electronic components 70 is generated in an early stage, and defective products can be removed. Therefore, it is possible to obtain the electronic components 70 having excellent reliability with a favorable yield.

The above-described temperature environment can be formed by, for example, putting the structure 100 into a constant-temperature vessel or an oven, or heating the electronic components using a heater provided in the stage 90.

(Step (C))

Next, after the step (B), the heat-resistant resin layer 10 is peeled off from the adhesive laminate film 50.

There is a case where the adhesive laminate film 50 is peeled off by hands; however, in general, the adhesive laminate film can be peeled off using a device called an automatic peeling machine.

(Step (D))

Next, after the step (C), the electronic components 70 are picked up from the adhesive resin layer 30.

By this pick-up, the electronic components 70 are peeled off from the adhesive laminate film 50.

The electronic components 70 can be picked up using a well-known method.

In the step (D), the electronic components 70 are preferably picked up from the adhesive resin layer 30 in a state in which the intervals between the adjacent electronic components 70 are expanded by extending regions to which the electronic components 70 are attached in the adhesive resin layer 30 in the in-plane direction of the film.

In such a case, the intervals between the adjacent electronic components 70 are expanded, and thus it becomes easy to pick up the electronic components 70 from the adhesive resin layer 30. Furthermore, the adhesive force between the electronic components 70 and the adhesive resin layer 30 is weakened by shear stress between the electronic components 70 and the adhesive resin layer 30 that is generated by the extension of the adhesive resin layer 30 in the in-plane direction, and thus it becomes easy to pick up the electronic components 70 from the adhesive resin layer 30.

(Step (E))

The method for manufacturing an electronic device according to the present embodiment may further include a step (E) of weakening the adhesive force of the adhesive resin layer 30 to the electronic components 70 by irradiating the adhesive resin layer 30 with radioactive rays and crosslinking the adhesive resin layer 30 before the step (D).

When the step (E) is carried out, it is possible to easily pick up the electronic components 70 from the adhesive resin layer 30. In addition, it is possible to suppress the surface of the electronic components 70 being contaminated by an adhesive component that configures the adhesive resin layer 30.

Radioactive rays are radiated to, for example, a surface opposite to the adhesive resin layer 30-side surface of the adhesive laminate film 50.

In a case where ultraviolet rays are used as the radioactive rays, a radiation dose of ultraviolet rays that are radiated to the adhesive laminate film 50 is preferably equal to or more than 100 mJ/cm$^2$ and more preferably equal to or more than 350 mJ/cm$^2$.

When the radiation dose of ultraviolet rays is equal to or more than the above-described lower limit value, it is possible to sufficiently weaken the adhesive force of the adhesive resin layer 30, and consequently, it is possible to further suppress the generation of adhesive deposits on the surfaces of the electronic components 70.

In addition, the upper limit of the radiation dose of ultraviolet rays that are radiated to the adhesive laminate film 50 is not particularly limited, but is, for example, preferably equal to or less than 1,500 mJ/cm$^2$ and more preferably equal to or less than 1,200 mJ/cm$^2$ from the viewpoint of productivity.

Ultraviolet rays can be radiated using, for example, a high-pressure mercury lamp or an LED.

The step (E) may be carried out before the step (B) or the step (C) and may be carried out after the step (C), but is preferably carried out before the step (B), between the step (B) and the step (C), or between the step (C) and the step (D) and more preferably carried out before the step (B).

(Other Steps)

The method for manufacturing an electronic device according to the present embodiment may have steps other than the above-described steps. As the other steps, it is possible to use steps that are well known for methods for manufacturing an electronic component.

For example, after the step (D), an arbitrary step that is generally carried out in a step of manufacturing an electronic component such as a step of mounting the electronic components 70 such as the obtained semiconductor chips on a circuit substrate, a wire bonding step, a sealing step, or the like may be further carried out.

In addition, in a case where a semiconductor substrate having a circuit surface is used as the electronic component 70, the method for manufacturing an electronic device may further have, for example, a step of forming an electrode on the circuit-formed surface of the semiconductor substrate using an ordinarily-used method and forming a protective film on a non-circuit-formed surface. A manufacturing method provided with the step in which the formation of an electrode and resin sealing are carried out is also referred to as a wafer level package (WLP).

In addition, the method for manufacturing an electronic device may further have a step of forming a rewiring layer on the circuit surface of the electronic component. An electronic device that is obtained by forming a rewiring layer in a range that is wider than the area of the semiconductor chips is also referred to as a fan-out package.

Hitherto, the embodiment of the present invention has been described, but this is an example of the present invention, and it is also possible to employ a variety of configurations other than what has been described above.

Meanwhile, the present invention is not limited to the above-described embodiment, and the present invention can be modified, improved, and the like as long as the object of the present invention can be achieved.

Hereinafter, the present invention will be specifically described using examples, but the present invention is not limited thereto.

The detail of materials that are used to produce adhesive laminate films is as described below.

<Heat-Resistant Resin Layer>

Heat-resistant resin layer 1: Polyethylene terephthalate (PET) film (manufactured by Unitika Ltd., trade name: EMBLET (registered trademark) S-50, melting point: 260° C., decomposition temperature: approximately 400° C., thickness: 50 μm)

<Flexible Resin for Forming Flexible Resin Layer>

Flexible resin 1: Polyester-based elastomer (manufactured by Du Pont-Toray Co., Ltd., trade name: HYTREL (registered trademark) 4767N, melting point: 200° C.)

<Adhesive for Forming Adhesive Resin Layer>

(Adhesive 1 (Ultraviolet-Curable Acrylic Adhesive))

Ethyl acrylate (48 parts by weight), 2-ethylhexyl acrylate (27 parts by mass), methyl acrylate (20 parts by weight), glycidyl methacrylate (5 parts by mass), and, as a polymerization initiator, benzoyl peroxide (0.5 parts by weight) were mixed together. This mixture was added dropwise to a nitrogen-substituted flask including toluene (65 parts by weight) and ethyl acetate (50 parts by weight) at 80° C. for five hours under stirring and further stirred for five hours to react the components. After the end of the reaction, the solution was cooled, xylene (25 parts by weight), acrylic acid (2.5 parts by weight), and tetradecylbenzylammonium chloride (1.5 parts by weight) were added thereto, and the components were reacted at 80° C. for 10 hours while the air is blown into the flask, thereby obtaining a solution of an acrylic acid ester copolymer to which a photopolymerizable carbon-carbon double bond was introduced.

To this solution, benzoin (7 parts by weight) as an ultraviolet polymerization initiator, an isocyanate-based crosslinking agent (manufactured by Mitsui Chemicals, Inc., trade name: OLESTER P49-75S) (2 parts by weight), and dipentaerythritol hexacrylate (manufactured by Toagosei Company, Limited, trade name: ARONIX M-400) (15 parts by weight) were added (with respect to 100 parts by weight of the copolymer (solid content)), thereby obtaining an adhesive 1 (ultraviolet-curable acrylic adhesive).

<Adhesive for Forming Adhesive Layer>

(Adhesive Resin Solution 1)

4,4'-azobis-4-cyanovaleric acid (manufactured by Otsuka Chemical Co., Ltd., trade name: ACVA) (0.5 parts by mass) as a polymerization initiator, n-butyl acrylate (74.3 parts by mass) and methyl methacrylate (13.7 parts by mass) as monomers (A), 2-hydroxyethyl methacrylate (9 parts by mass) as a monomer (B), a surfactant obtained by introducing a polymerizable 1-propenyl group into a benzene ring of an ammonium salt of a sulfuric acid ester of polyoxyethylene nonylphenyl ether (manufactured by DKS Co., Ltd.; trade name: AQUARON HS-1025) (3 parts by mass) as a polymerizable surfactant were respectively injected into deionized pure water, and emulsion polymerization was carried out under stirring at 70° C. to 72° C. for eight hours, thereby obtaining an acrylic resin emulsion. The acrylic resin emulsion was neutralized (pH=7.0) with ammonia water, thereby obtaining an adhesive resin solution 1 having a solid content concentration of 42.5%.

(Adhesive Resin Solution 2)

Ammonium persulfate (0.5 parts by mass) as a polymerization initiator, 2-ethylhexylacrylate (63 parts by mass), n-butyl acrylate (21 parts by mass), and methyl methacrylate (9 parts by mass) as the monomers (A), 2-hydroxyethyl methacrylate (3 parts by mass) as the monomer (B), polytetramethylene glycol diacrylate (manufactured by NOF Corporation, trade name; ADT-250) (1 part by mass), and the surfactant obtained by introducing a polymerizable 1-propenyl group into a benzene ring of an ammonium salt of a sulfuric acid ester of polyoxyethylene nonylphenyl ether (manufactured by DKS Co., Ltd.; trade name: AQUARON HS-1025) (2 parts by mass) as a polymerizable surfactant were respectively injected into deionized pure water, and emulsion polymerization was carried out under stirring at 70° C. to 72° C. for eight hours, thereby obtaining an acrylic resin emulsion. The acrylic resin emulsion was neutralized (pH=7.0) with ammonia water, thereby obtaining an adhesive resin solution 2 having a solid content concentration of 56.5%.

(Adhesive coating fluid 1)

The adhesive resin solution 1 (57.4 parts by mass), the adhesive resin solution 2 (42.6 parts by mass), dimethylethanolamine (0.4 parts by mass), and an epoxy-based compound (manufactured by Nagase ChemteX Corporation, Ex-1610) (9.3 parts by mass) that was a crosslinking agent were respectively mixed together, thereby obtaining an adhesive coating fluid 1.

(Adhesive Coating Fluid 2)

The adhesive resin solution 1 (100 parts by mass), polypropylene glycol (10.0 parts by mass), and an aziridine-based compound (manufactured by Nippon Shokubai Co., Ltd., CEHMITITE Pz-33) (1.7 parts by mass) that was a crosslinking agent were respectively mixed together, thereby obtaining an adhesive coating fluid 2.

Example 1

The adhesive coating fluid 1 was applied and then dried on the heat-resistant resin layer 1, thereby forming a 20 μm-thick adhesive layer. Next, a film configured of the flexible resin 1 (thickness: 110 μm, elastic modulus: 55 MPa (based on JIS K7161 and measured under conditions of a sample width of 10 mm, an inter-chuck distance of 30 mm, and a tensile rate of 300 mm/minute)) that served as a flexible resin layer was laminated on the adhesive layer.

Next, the coating fluid of the adhesive 1 was applied and then dried on the flexible resin layer of the obtained film to form a 20 μm-thick adhesive resin layer, thereby obtaining an adhesive laminate film.

The following evaluations were carried out on the obtained adhesive laminate film. The obtained results are shown in Table 1.

Example 2

An adhesive laminate film was obtained in the same manner as in Example 1 except for the fact that the thickness of the adhesive layer was changed to 10 μm.

The following evaluations were carried out on the obtained adhesive laminate film. The obtained results are shown in Table 1.

Comparative Example 1

An adhesive laminate film was obtained in the same manner as in Example 1 except for the fact that no adhesive layer was formed on the heat-resistant resin layer 1.

The following evaluations were carried out on the obtained adhesive laminate film. The obtained results are shown in Table 1.

Comparative Example 2

An adhesive laminate film was obtained in the same manner as in Example 1 except for the fact that the adhesive coating fluid 2 was used instead of the adhesive coating fluid 1.

The following evaluations were carried out on the obtained adhesive laminate film. The obtained results are shown in Table 1.

<Evaluation>

(1) Measurement of peel strength $P_0$ and peel strength $P_1$ between heat-resistant resin layer and flexible resin layer The peel strength $P_0$ and the peel strength $P_1$ between the heat-resistant resin layer and the flexible resin layer were measured using the following method on the basis of JIS 20237.

First, the adhesive laminate film was attached to a silicon wafer (manufactured by SUMCO Corporation, trade name: SILICON MIRRO WAFER, thickness: 760 μm) so that the adhesive resin layer came into contact with the silicon wafer. Next, the heat-resistant resin layer was peeled off from the flexible resin layer using a tensile tester (manufactured by Toyo Seiki Co., Ltd., trade name: STROGRAPH) in a 180-degree direction under conditions of 25° C. and a tensile rate of 300 mm/minute, the strength (N/25 mm) at this time was measured twice, and the average value was regarded as the peel strength $P_0$.

In addition, the adhesive laminate film was thermally treated on a hot plate at 160° C. for four hours, and then the peel strength $P_1$ between the heat-resistant resin layer and the flexible resin layer in the adhesive laminate film was measured using the same method as the method for measuring the peel strength $P_0$. At this time, the heat-resistant resin layer side was placed on the hot plate.

(2) Property of Picking Up Electronic Components

A plurality of electronic components (silicon chips) was disposed on the adhesive layer of the adhesive laminate film, thereby obtaining a structure.

Next, the obtained structure was thermally treated on a hot plate at 160° C. for four hours, and then the heat-resistant resin layer was peeled off from the flexible resin layer. At this time, the heat-resistant resin layer side was placed on the hot plate.

Next, the property of picking up the electronic components was evaluated using the following standards.

O: The heat-resistant resin layer could be favorably peeled off from the flexible resin layer, the positional deviation of the silicon chips or the deformation of the adhesive resin layer and the flexible resin layer did not occur, and the silicon chips could be accurately picked up afterwards.

X: The heat-resistant resin layer could be peeled off from the flexible resin layer, but the peeling was not easy, the positional deviation of the silicon chips or the deformation of the adhesive resin layer and the flexible resin layer occurred during the peeling, and the silicon chips could not be accurately picked up afterwards.

XX: The heat-resistant resin layer and the flexible resin layer were strongly adhered to each other, and it was not possible to peel off the heat-resistant resin layer from the flexible resin layer

TABLE 1

|  |  | Example 1 | Example 2 | Comparative Example 1 | Comparative Example 2 |
|---|---|---|---|---|---|
| Peel strength | $P_0$ [N/25 mm] | 0.083 | 0.073 | Not measureable | 0.093 |
|  | $P_1$ [N/25 mm] | 0.29 | 0.24 | Not measureable | 1.9 |
| Evaluation results | Property of picking up electronic components | O | O | XX | X |

In the adhesive laminate films of Examples 1 and 2 in which the peel strength $P_0$ was equal to or more than 0.01 N/25 mm and equal to or less than 2.0 N/25 mm and the peel strength $P_1$ was equal to or more than 0.05 N/25 mm and equal to or less than 1.5 N/25 mm, even after the adhesive laminate films were thermally treated on the hot plate at 160° C. for four hours, the heat-resistant resin layer could be favorably peeled off from the flexible resin layer, the positional deviation of the silicon chips or the deformation of the adhesive resin layer and the flexible resin layer did not occur, and the silicon chips could be accurately picked up afterwards. That is, it is possible to understand that, according to the adhesive laminate film 50 according to the present embodiment, it is possible to simplify a characteristic evaluation step of electronic components and accurately pick up the electronic components.

In contrast, the adhesive laminate films of Comparative Examples 1 and 2 were poor in terms of the property of picking up electronic components.

That is, it is possible to understand that, in the adhesive laminate films of Comparative Examples 1 and 2, it is not possible to satisfy both the simplification of a characteristic evaluation step of electronic components and a property of picking up electronic components.

Priority is claimed on Japanese Patent Application No. 2016-229118, filed on Nov. 25, 2016, the content of which is incorporated herein by reference.

The invention claimed is:

1. An adhesive laminate film comprising:
a heat-resistant resin layer;
a flexible resin layer; and
an adhesive resin layer, the flexible resin layer being between the heat-resistant resin layer and the adhesive resin layer,
wherein a peel strength $P_0$ between the heat-resistant resin layer and the flexible resin layer, which is based on JIS Z0237 and measured using a method described below, is equal to or more than 0.01 N/25 mm and equal to or less than 2.0 N/25 mm, and a peel strength $P_1$ between the heat-resistant resin layer and the flexible resin layer after a thermal treatment of the adhesive laminate film at 160° C. for four hours is equal to or more than 0.05 N/25 mm and equal to or less than 1.5 N/25 mm,
method for measuring peel strength:
the adhesive laminate film is attached to a silicon wafer so that the adhesive resin layer comes into contact with the silicon wafer, next, the heat-resistant resin layer is peeled off from the flexible resin layer using a tensile tester in a 180-degree direction under conditions of 25° C. and a tensile rate of 300 mm/minute, and a peel strength between the heat-resistant resin layer and the flexible resin layer in N/25 mm is measured twice, and an average value of the two measurements is the peel strength.

2. The adhesive laminate film according to claim 1, wherein a tensile elastic modulus (E') of the flexible resin layer at 160° C., which is based on JIS K7161 and measured under conditions of a sample width of 10 mm, an inter-chuck distance of 30 mm, and a tensile rate of 300 mm/minute, is equal to or more than 1 MPa and equal to or less than 300 MPa.

3. The adhesive laminate film according to claim 1, wherein a melting point of the heat-resistant resin layer is equal to or higher than 200° C. or the heat-resistant resin layer has no melting point.

4. The adhesive laminate film according to claim 1, wherein a melting point of the flexible resin layer is equal to or higher than 100° C. and equal to or lower than 250° C.

5. The adhesive laminate film according to claim 1, wherein a heat-resistant resin that configures the heat-resistant resin layer includes one or more selected from the group consisting of a polyimide, a polyamide, and a polyester.

6. The adhesive laminate film according to claim 1, wherein a flexible resin that configures the flexible resin layer includes one or more selected from the group consisting of a polyester-based elastomer, a polyamide-based elastomer, a polyimide-based elastomer, and a polybutylene terephthalate.

7. The adhesive laminate film according to claim 1, further comprising:
an adhesive layer between the heat-resistant resin layer and the flexible resin layer.

8. The adhesive laminate film according to claim 7, wherein the adhesive layer between the heat-resistant resin layer and the flexible resin layer includes a (meth)acrylic adhesive.

9. The adhesive laminate film according to claim 8, wherein the (meth)acrylic adhesive includes a (meth)acrylic adhesive resin and a crosslinking agent, and
a content of the crosslinking agent in the (meth)acrylic adhesive is equal to or more than 5 parts by mass with respect to 100 parts by mass of the (meth)acrylic adhesive resin.

10. The adhesive laminate film according to claim 9, wherein the crosslinking agent includes one or more selected from the group consisting of an epoxy-based compound, an isocyanate-based compound, and an aziridine-based compound.

11. The adhesive laminate film according to claim 9,
wherein the (meth)acrylic adhesive resin that is included in the (meth)acrylic adhesive includes a polyfunctional monomer-derived configurational unit having equal to or more than two carbon-carbon double bonds in a molecule.

12. The adhesive laminate film according to claim 1,
wherein an adhesive that configures the adhesive resin layer includes one or more selected from the group consisting of a (meth)acrylic adhesive, a silicone-based adhesive, an urethane-based adhesive, an olefin-based adhesive, and a styrene-based adhesive.

13. The adhesive laminate film according to claim 1,
wherein a total light transmittance of the adhesive laminate film is equal to or more than 80%.

14. The adhesive laminate film according to claim 1,
wherein the adhesive laminate film is a dicing tape.

15. A structure including the adhesive laminate film according to claim 1, and one or more electronic components attached onto the adhesive resin layer.

16. A method for manufacturing an electronic device, comprising:
a step (A) of preparing a structure including the adhesive laminate film according to claim 1 having the heat-resistant resin layer, the flexible resin layer, and the adhesive resin layer, the flexible resin layer being between the heat-resistant resin layer and the adhesive resin layer, and one or more electronic components attached onto the adhesive resin layer,
a step (B) of evaluating characteristics of the electronic components in a state of being attached onto the adhesive resin layer,
a step (C) of peeling the heat-resistant resin layer from the adhesive laminate film after the step (B), and
a step (D) of picking up the electronic components from the adhesive resin layer after the step (C).

17. The method for manufacturing an electronic device according to claim 16,
wherein, in the step (B), the characteristics of the electronic components are evaluated in a temperature environment of: (i) equal to or lower than 0° C. or (ii) equal to or higher than 50° C. and equal to or lower than 200° C.

18. The method for manufacturing an electronic device according to claim 16,
wherein, in the step (D), the electronic components are picked up in a state in which intervals between the electronic components adjacent to each other are expanded by extending regions to which the electronic components are attached in the adhesive resin layer in an in-plane direction of the film.

* * * * *